US012644790B2

(12) United States Patent
Tang et al.

(10) Patent No.: US 12,644,790 B2
(45) Date of Patent: Jun. 2, 2026

(54) REAR COVER OF ELECTRONIC DEVICE, ELECTRONIC DEVICE, AND AIR TIGHTNESS DETECTION SYSTEM OF ELECTRONIC DEVICE

(71) Applicant: HONOR DEVICE CO., LTD., Shenzhen (CN)

(72) Inventors: Yangjie Tang, Shenzhen (CN); Baojun Gao, Shenzhen (CN); Kangle Xue, Shenzhen (CN); Kuibing Zhao, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 356 days.

(21) Appl. No.: 18/276,524

(22) PCT Filed: Jan. 6, 2023

(86) PCT No.: PCT/CN2023/070955
§ 371 (c)(1),
(2) Date: Aug. 9, 2023

(87) PCT Pub. No.: WO2023/134569
PCT Pub. Date: Jul. 20, 2023

(65) Prior Publication Data
US 2024/0118163 A1     Apr. 11, 2024

(30) Foreign Application Priority Data

Jan. 12, 2022     (CN) ......................... 202220081030.X

(51) Int. Cl.
G01M 3/32          (2006.01)
H04M 1/02          (2006.01)
(Continued)

(52) U.S. Cl.
CPC ........ G01M 3/3209 (2013.01); G01M 3/3272 (2013.01); H04M 1/026 (2013.01);
(Continued)

(58) Field of Classification Search
CPC .. G01M 3/3209; G01M 3/3272; H04M 1/026; H04M 1/24; H04M 1/18;
(Continued)

(56) References Cited

U.S. PATENT DOCUMENTS

| | | | |
|---|---|---|---|
| 10,545,068 B2 * | 1/2020 | Maurischat | ............. F16K 1/443 |
| 11,165,894 B2 | 11/2021 | Li et al. | |
| 2017/0160160 A1 * | 6/2017 | Hugel | .................. G01L 19/003 |

FOREIGN PATENT DOCUMENTS

| | | |
|---|---|---|
| CN | 206181153 U | 5/2017 |
| CN | 208445740 U | 1/2019 |

(Continued)

*Primary Examiner* — Francis C Gray
(74) *Attorney, Agent, or Firm* — WOMBLE BOND DICKINSON (US) LLP

(57) ABSTRACT

Embodiments of this application provide a rear cover of an electronic device, an electronic device, and an air tightness detection system of an electronic device. The electronic device may include a mobile or fixed terminal having waterproof performance such as a mobile phone, a tablet computer, or a notebook computer. The rear cover includes a body portion and a structure layer fixed to a rear surface of the body portion. A smooth detection plane is formed on a rear surface of the structure layer, and a rear end of a balance channel of the rear cover is located within the detection plane, thereby resolving the problem that the material of the rear cover affects air tightness detection on the electronic device.

20 Claims, 4 Drawing Sheets

(51) Int. Cl.
    *H04M 1/24*        (2006.01)
    *H05K 5/02*        (2006.01)
    *H05K 5/03*        (2006.01)
    *H05K 5/06*        (2006.01)

(52) U.S. Cl.
    CPC ............ *H04M 1/24* (2013.01); *H05K 5/0215*
          (2022.08); *H05K 5/0216* (2022.08); *H05K*
        *5/03* (2013.01); *H05K 5/061* (2013.01); *H05K*
                              *5/068* (2013.01)

(58) Field of Classification Search
    CPC ...... H05K 5/0215; H05K 5/0216; H05K 5/03;
                         H05K 5/061; H05K 5/068
    See application file for complete search history.

(56)                  References Cited

FOREIGN PATENT DOCUMENTS

| | | | | | |
|---|---|---|---|---|---|
| CN | 110365820 | A | | 10/2019 | |
| CN | 210609318 | U | | 5/2020 | |
| CN | 212621327 | U | | 2/2021 | |
| CN | 110719397 | B | * | 7/2021 | ............ H04N 23/50 |
| CN | 113236776 | A | | 8/2021 | |
| CN | 217586157 | U | | 10/2022 | |
| KR | 102009422 | B1 | * | 8/2019 | ............ G01M 3/26 |
| WO | 2012073513 | A1 | | 6/2012 | |
| WO | 2020192489 | A1 | | 10/2020 | |

* cited by examiner

REAR COVER OF ELECTRONIC DEVICE, ELECTRONIC DEVICE, AND AIR TIGHTNESS DETECTION SYSTEM OF ELECTRONIC DEVICE

CROSS-REFERENCE TO RELATED APPLICATIONS

This application is a national stage of International Application No. PCT/CN2023/070955, filed on Jan. 6, 2023, which claims priority to Chinese Patent Application No. 202220081030.X, filed on Jan. 12, 2022. The disclosures of both of the aforementioned applications are hereby incorporated by reference in their entireties.

TECHNICAL FIELD

This application relates to the field of communication device technologies, and in particular, to a rear cover of an electronic device, an electronic device, and an air tightness detection system of an electronic device.

BACKGROUND

With the advancement of communication technologies, electronic devices such as mobile phones have become indispensable communication tools and entertainment tools for modern people. However, during daily use, electronic devices are inevitably in contact with water, resulting in a case that the water comes inside to damage the screens or cause the internal circuit boards to burn out. Therefore, electronic devices with waterproof performance are popular. However, with the improvement of waterproof performance, the overall sealing performance of the electronic device is also improved, and during use, the internal air pressure of the electronic device may change due to problems such as a temperature change or product deformation. Therefore, a waterproof and air-permeable balance valve needs to be arranged, to ensure the waterproof performance while balancing the pressure difference inside and outside the electronic device.

To ensure the sealing effect of the electronic device after assembly, an air tightness test needs to be performed on the assembled electronic device. The specific test is to cover a hood body on a rear cover of the electronic device through a fixing fixture, so that the balance valve is located within the hood body, then perform a pressurization or depressurization operation inside the hood body, and simultaneously monitor the pressure inside the hood body. If the pressure change inside the hood body can be stabilized within a certain value range, it means that the sealing performance of the electronic device is good.

However, with the increasing diversified needs for the material of the rear cover of the electronic device, such as a vegan leather rear cover with a textured surface or a glass rear cover with decorative textures, when the hood body covers the rear cover for air tightness detection, due to unevenness of the rear surface of the rear cover, effective sealing cannot be achieved between the hood body and the rear cover, which will affect the detection of air tightness.

SUMMARY

Embodiments of this application provide a rear cover of an electronic device, an electronic device, and an air tightness detection system of an electronic device, which resolves the problem that the material of the rear cover affects the air tightness detection on the electronic device.

A first aspect of the embodiments of this application provides a rear cover of an electronic device, including a body portion and a structure layer, where the structure layer is fixed on a rear surface of the body portion, a rear surface of the structure layer forms a smooth detection plane, and the detection plane is capable of being attached to an opening end of a hood body for detecting air tightness in a sealed manner; and a balance channel is provided through the body portion and the structure layer in a thickness direction, a waterproof and air-permeable balance valve is arranged in the balance channel, and a rear end of the balance channel is located within the detection plane.

Due to the arrangement of the detection plane of the structure layer, the accuracy of the sealing performance test results can be ensured, and the structures and materials at positions of the rear cover other than the structure layer are all not limited, thereby having high flexibility and meeting the diversified needs of users.

Based on the first aspect, the embodiments of this application further provide a first implementation of the first aspect:

the body portion is provided with a first balance hole, the structure layer is provided with a second balance hole, an air-permeable channel is provided between a front surface of the structure layer and the rear surface of the body portion, the first balance hole, the air-permeable channel, and the second balance hole are sequentially in communication with each other and form the balance channel, and the second balance hole is located at the rear end of the balance channel. Such arrangement facilitates the deployment of the first balance hole and the second balance hole, making the arrangement positions of the balance holes more flexible.

Based on the first implementation of the first aspect, the embodiments of this application further provide a second implementation of the first aspect:

the front surface of the structure layer and the rear surface of the body portion are bonded by an adhesive bonding layer, and the adhesive bonding layer is provided with the air-permeable channel. When the air-permeable channel is formed through the adhesive bonding layer, the manufacturing process can be simplified and the processing cost can be reduced.

Based on the first or second implementation of the first aspect, the embodiments of this application further provide a third implementation of the first aspect:

the structure layer is a lens glass cover plate. The rear surface of the lens glass cover plate has a smooth plane structure, so that when the lens glass cover plate is directly used as the structure layer, the overall structure can be simplified, and it is unnecessary to separately arrange another structure layer on the rear surface of the rear cover.

Based on the third implementation of the first aspect, the embodiments of this application further provide a fourth implementation of the first aspect:

The rear cover of an electronic device further includes a flash shield, where the lens glass cover plate is provided with a first mounting hole adapted to the flash shield, and a gap between an inner wall of the first mounting hole and an outer wall of the flash shield forms the second balance hole. Such arrangement can simplify the overall structure and make the overall structure more regular. In addition, when a lens film is applied, the rear end of the balance channel will not be blocked.

Based on any one of the first to the fourth implementations of the first aspect, the embodiments of this application further provide a fifth implementation of the first aspect:

the body portion includes a cover body and a mounting member, the cover body is provided with a second mounting hole, the mounting member is mounted inside the second mounting hole, and is circumferentially fixed in a sealed manner, the structure layer is fixed on a rear surface of the mounting member, and the mounting member is provided with the first balance hole. Based on such arrangement, only the mounting member needs to be processed, so that the balance channel is provided through the mounting member and the structure layer is fixed to the mounting member. Specifically, the mounting member may be set to be a metal material, which facilitates finishing on the mounting member and can reduce the processing cost; and it is unnecessary to make a requirement for the material of the cover body, thereby meeting the diversified needs of users.

Based on the fifth implementation of the first aspect, the embodiments of this application further provide a sixth implementation of the first aspect:

a protrusion is circumferentially arranged on a rear surface edge of the mounting member, the protrusion forms a mounting groove in an enclosed manner, the structure layer is located inside the mounting groove, and a rear end surface of the protrusion transitions smoothly with the rear surface of the structure layer. The protrusion can protect the structure layer located inside the mounting groove, and when viewed from the side, only the protrusion of the mounting member is visible, and the structure layer is invisible. Such arrangement can also improve the aesthetics, thereby improving the user experience.

Based on any one of the first to the sixth implementations of the first aspect, the embodiments of this application further provide a seventh implementation of the first aspect:

the balance valve is arranged on a front surface of the body portion, and is fixed to the front surface of the body portion in a circumferential direction of the first balance hole in a sealed manner. Based on such arrangement, no mounting space needs to be provided for the balance valve between the body portion and the structure layer, which can reduce the overall thickness of the rear cover and reduce mounting requirements.

Based on the seventh implementation of the first aspect, the embodiments of this application further provide an eighth implementation of the first aspect:

an annular boss is further arranged on the front surface of the body portion in the circumferential direction of the first balance hole, a front end surface of the annular boss forms a sealing surface, and the sealing surface is configured to block the balance channel through a sealing member. The arrangement of the annular boss can ensure fitting with the sealing member for sealing, and avoid interference between the sealing member and the balance valve when the balance channel is blocked through the sealing member, so as to ensure the state of the balance valve during individual air tightness detection on the rear cover to be consistent with the state of the balance valve during air tightness detection of the whole machine.

Based on any one of the first aspect, or the first to the eighth implementations of the first aspect, the embodiments of this application further provide a ninth implementation of the first aspect:

the balance valve includes a waterproof and air-permeable membrane. Such arrangement can simplify the structure of the balance valve and reduce the thickness of the balance valve, thereby reducing the overall thickness of the rear cover, and helping to realize the objective of lightening and thinning the electronic device.

Based on the ninth implementation of the first aspect, the embodiments of this application further provide a tenth implementation of the first aspect:

the balance valve further includes a support sheet, the support sheet is fixed to the waterproof and air-permeable membrane through bonding, and the support sheet is provided with a through hole in communication with the balance channel. The support sheet can provide support for the waterproof and air-permeable membrane, so as to avoid rupture of the waterproof and air-permeable membrane due to changes in air pressure.

Based on any one of the first aspect, or the first to the tenth implementations of the first aspect, the embodiments of this application further provide an eleventh implementation of the first aspect:

the rear surface of the body portion is formed by splicing one or at least two of a vegan leather layer, a silica gel layer, a glass layer, a ceramic layer, or a metal layer. The setting of the material of the rear surface of the body portion has high flexibility, which can meet the diversified needs of users.

A second aspect of the embodiments of this application provides an electronic device, including the rear cover according to any one of the first aspect, or the first to the eleventh implementations of the first aspect.

Technical effects of the electronic device having the foregoing rear cover are similar to the technical effects of the foregoing rear cover. To save space, details are not described herein again.

A third aspect of the embodiments of this application provides an air tightness detection system of an electronic device, including a detection apparatus and the electronic device according to the second aspect, where the detection device includes a hood body and a fixing fixture, an opening end of the hood body is capable of being attached to the detection plane on the rear surface of the structure layer, and is fixed to the electronic device through the fixing fixture, so that the opening end of the hood body is attached to the detection plane in a sealed manner.

Technical effects of the air tightness detection system having the foregoing electronic device are similar to the technical effects of the foregoing electronic device. To save space, details are not described herein again.

Figure 1:
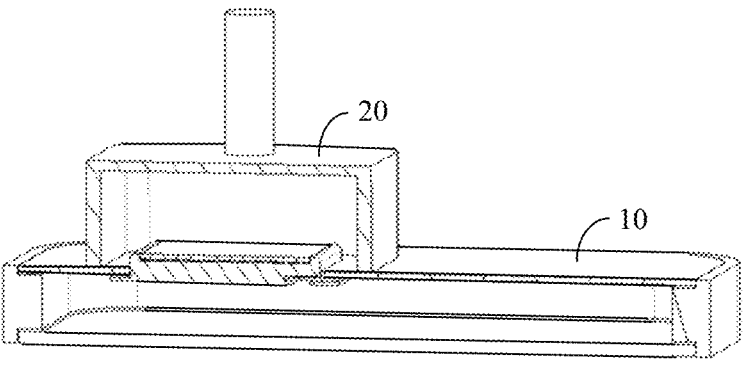
FIG. 1 is a schematic structural diagram of a rear cover of an electronic device and a hood body in a detection state in the related art.
Figure 2:
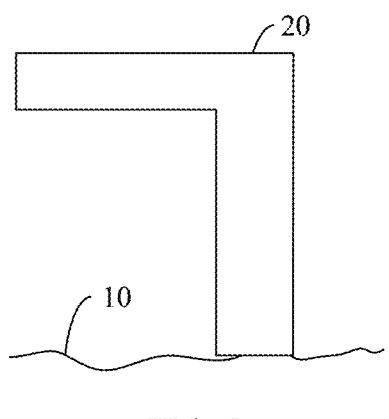
FIG. 2 is a schematic structural diagram of the hood body and a rear surface of the rear cover in FIG. 1.

Descriptions of reference numerals in FIG. 1 to FIG. 7 are as follows:

10—rear cover; 20—hood body;

1—body portion, 11—first balance hole, 12—cover body, 13—mounting member, 131—extension edge, 14—protrusion, 15—annular boss, 16—sealing surface;

2—structure layer, 21—detection plane, 22—second balance hole;

3—air-permeable channel;

4—balance valve, 41—waterproof and air-permeable membrane, 42—support sheet, 421—through hole, 43—first adhesive layer, 44—second adhesive layer;

5—adhesive bonding layer;

6—flash shield;

71—rear end of a balance channel; 72—front end of the balance channel.

DESCRIPTION OF EMBODIMENTS

Embodiments of this application provide an electronic device, which includes, but not limited to, a mobile or fixed terminal with waterproof performance such as a mobile phone, a tablet computer, or a notebook computer.

Electronic devices such as mobile phones have become indispensable tools in modern people's work, life, and entertainment communication. Mobile phones are used as an example. In daily life, people holding mobile phones can be seen at any time in any place. However, for a mobile phone without the waterproof function, if water enters the mobile phone accidentally, the screen of the mobile phone may fail and the internal circuit board may burn out. Therefore, in order to further meet the use needs of users, among the existing mobile phones, some products can meet the daily waterproof performance, so that users can make calls or perform photographing in the rain, so as to improve the user experience.

During designing of products of electronic devices such as mobile phones, the whole tightness of a high-level waterproof electronic device is relatively good. However, during use of the electronic device, it is inevitable that the internal air pressure of the electronic device will change due to a temperature change, or when the air pressure of the external environment changes, a pressure difference occurs between the inside and outside of the electronic device. Therefore, a balance valve needs to be arranged. The balance valve has a waterproof and air-permeable function, and the pressure difference inside and outside the electronic device is balanced through the balance valve, so as to avoid a case that the pressure difference causes deformation of the electronic device and even affects the normal operation of the electronic device.

In order to ensure the sealing effect of the high-level waterproof electronic device after assembly, the air tightness of the electronic device is usually detected by a detection device. Specifically, as shown in FIG. 1, the detection device includes a hood body 20 and a fixing fixture (not shown in the figure). The hood body 20 is equivalent to a sealing hood provided with an opening on only one side, and an opening end of the hood body 20 is attached to a rear cover 10 of an electronic device, so that a rear end of a balance channel is located inside the hood body 20. In addition, the hood body 20 and the electronic device are clamped and fixed by the fixing fixture, and then a pressurization or depressurization operation may be performed inside the hood body 20, and the pressure inside the hood body 20 may be simultaneously monitored. If the pressure change inside the hood body 20 can be stabilized within a certain value range, it means that the balance channel can play a balancing role, and the sealing performance of the whole electronic device is good.

At present, due to the diversified needs of users, the material of the rear cover 10 may be vegan leather (polyurethane, Polyurethane, PU), silica gel, plant leather, animal leather, or the like, which can not only meet the aesthetics, but also meet users' comfortable-touch and skin-friendly needs during use. Alternatively, when the rear cover 10 is made of a metal, glass, or ceramic material, the rear surface is provided with a textured pattern to improve aesthetics and anti-slip performance. Alternatively, the rear cover 10 is set to being spliced by splice layers of different materials, and rear surfaces of the splice layers are merely smoothly transitioned at the splicing seams rather than having a coplanar structure. If the hood body 20 is directly covered on the rear surface of the rear cover 10 in each of the above cases, then it may be shown in FIG. 2, the position at which the rear surface of the rear cover 10 fits with the hood body 20 is uneven, so that an end surface of the opening end of the hood body 20 and the rear surface of the rear cover 10 cannot be attached to each other in a sealed manner, and then the sealing performance cannot be detected.

Figure 3:
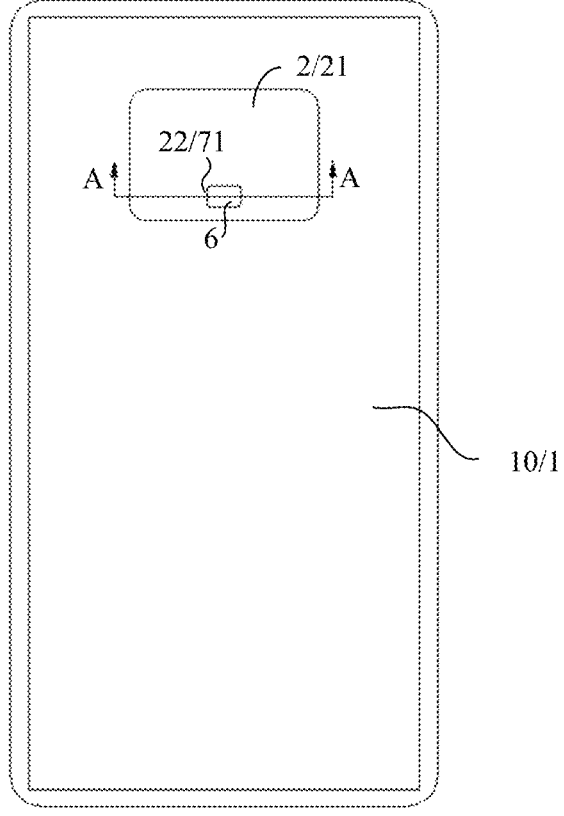
FIG. 3 is a schematic diagram of a three-dimensional structure of an electronic device according to an embodiment of this application.
Figure 4:
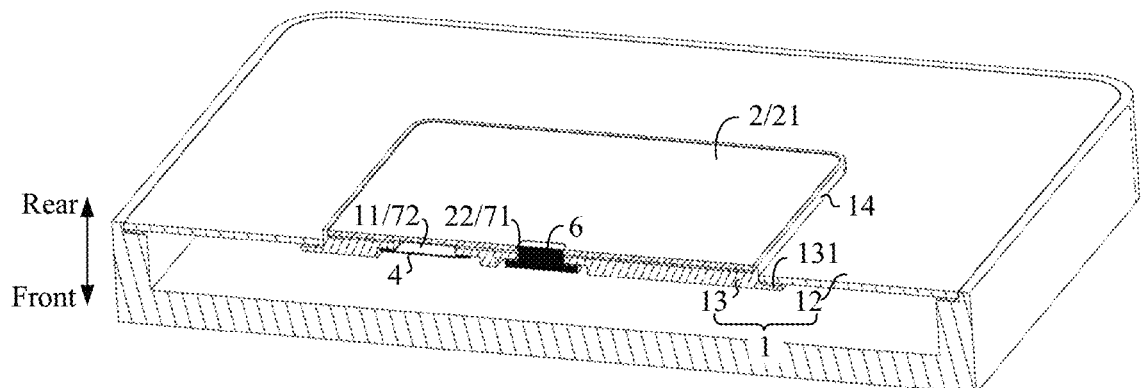
FIG. 4 is a cross-sectional view along A-A in FIG. 3.

In order to ensure the accuracy of the air tightness detection on the electronic device through the detection device, as shown in FIG. 3 and FIG. 4, the rear cover 10 of the electronic device includes a body portion 1 and a structure layer 2. The structure layer 2 is fixed to a rear surface of the body portion 1, and is shown as the lens glass cover plate in FIG. 3. A balance channel is provided through the body portion 1 and the structure layer 2 in a thickness direction (front-rear direction). A front end 72 of the balance channel passes through a front surface of the body portion 1, and a rear end 71 of the balance channel passes through a rear surface of the structure layer 2. In addition, the balance channel is provided with a balance valve 4, and the balance valve 4 can play a waterproof and air-permeable role, so that the internal and external air pressure of the electronic device can reach a balanced state through the balance channel, and the external water cannot enter the interior of the electronic device through the balance channel, thereby ensuring the waterproof performance and usability of the electronic device.

It is not difficult to understand that the screen of the electronic device is located on a front side of the rear cover 10, and the rear cover 10 is located on a rear side of the screen. Therefore, for the convenience of description, in the embodiments of this application, a side facing the screen is referred to as the "front side", and a side facing the rear cover 10 is referred to as the "rear side".

The rear surface of the structure layer 2 is set to a smooth plane structure and forms a detection plane 21. In other words, the surface of the detection plane 21 is smooth, which specifically refers to a plane that is not provided with textures, for example, a rear surface of a lens glass cover plate. During air tightness detection on the electronic device, the detection plane 21 is used as a plane attached to the opening end of the hood body 20 in a sealed manner.

Specifically, the rear end 71 of the balance channel is located within the detection plane 21, and the rear end 71 of the balance channel is not arranged on an edge of the detection plane 21 or outside the detection plane 21. Specifically, the detection plane 21 is a complete plane structure, and the rear end 71 of the balance channel passes through the detection plane 21. The detection plane 21 can circumferentially surround the rear end 71 of the balance channel. In this way, the detection plane 21 further has a fitting region in the circumferential direction of the rear end 71 of the balance channel, and the detection plane 21 is a smooth plane structure, so that the fitting region is also a smooth plane structure. When the hood body 20 is covered on the detection plane 21 and air tightness detection is performed, the opening end of the hood body 20 may be attached to the fitting region, so that the rear end 71 of the balance channel can be located inside the hood body 20. In this way, the sealing performance of attachment between the hood body 20 and the detection plane during the air tightness detection can be ensured, thereby preventing poor sealing performance between the hood body 20 and the rear cover 10 from affecting the accuracy of the air tightness detection.

In this embodiment, the material of the structure layer 2 may be metal, ceramics, glass, or the like, and the rear surface thereof is processed to form a smooth plane. Due to the arrangement of the detection plane 21 of the structure layer 2, the accuracy of the sealing performance test results can be ensured, and the material of the body portion 1 is not limited. For example, the material of the body portion 1 may be set to metal, ceramics, glass, or the like, and the rear surface of the body portion 1 may be provided with a textured pattern. The material of the body portion 1 may also be vegan leather, silica gel, plant leather, animal leather, or the like. Alternatively, the body portion 1 may be set to being spliced by splice layers of different materials, thereby having high flexibility and meeting the diversified needs of users.

As shown in FIG. 3, the lens glass cover plate of the electronic device may be used as the structure layer 2, and the lens glass cover plate is provided with a second balance hole 22, so that the rear end 71 of the balance channel is located inside the lens glass cover plate. Because the rear surface of the lens glass cover plate has a smooth plane structure, when the lens glass cover plate is directly used as the structure layer 2, the overall structure can be simplified, and it is unnecessary to separately arrange another structure layer 2 on the rear surface of the rear cover 10.

Figure 5:
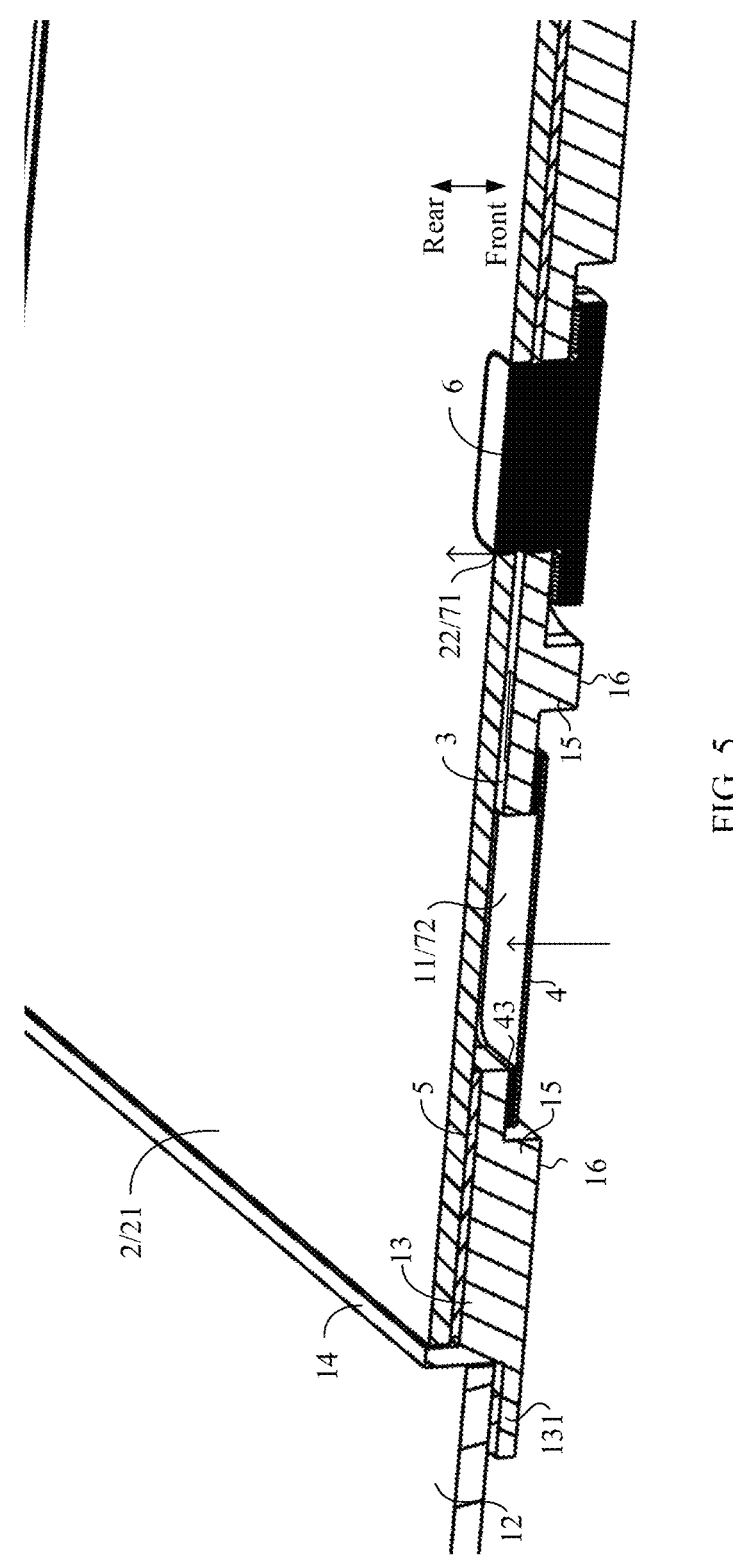
FIG. 5 is a partially enlarged view of FIG. 4.

The rear cover 10 further includes a flash shield 6. As shown in FIG. 4 and FIG. 5, a first mounting hole is provided at a position of the structure layer 2 corresponding to a flashlight of the electronic device, and the flash shield 6 is mounted in the first mounting hole for protecting the flashlight. In addition, when the flash shield 6 and the first mounting hole are circumferentially fixed in a sealed manner, there is a gap at a local position. The gap can be in communication with an air-permeable channel 3, and form the foregoing second balance hole 22. Because the gap is relatively small from the appearance, the user experience will not be affected.

Alternatively, the second balance hole 22 may be provided separately in the structure layer 2, and may be spaced apart from the first mounting hole. When a gap between an outer wall of the flash shield 6 and an inner wall of the first mounting hole forms the second balance hole 22, the overall structure can be simplified, and the overall structure can be more regular, thereby improving the user experience.

Some users have a need to apply a lens film on the rear surface of the lens glass cover plate, and the lens film may cover the entire rear surface of the lens glass cover plate. In this case, if the gap between the flash shield 6 and the first mounting hole forms the second balance hole 22, the lens film may only be provided with a hole structure adapted to the flash shield 6, and it is unnecessary to consider the second balance hole 22 and separately set a hole structure, then the communication of the balance channel can be ensured. In other words, from the perspective of the external structure, the rear cover 10 of an electronic device has the same structure as the original rear cover 10 of an electronic device, and even if a lens film produced by a third manufacturer is used, it can be ensured that the rear end 71 of the balance channel will not be blocked, thereby having good versatility.

Certainly, in this embodiment, the structure layer 2 may alternatively be set as a decorative layer arranged on the rear cover 10. For example, the front surface of the structure layer 2 is provided with patterns, text, printing, and the like, the structure layer 2 is a transparent layer and the patterns, text, printing, and the like can be seen through the structure layer, and the rear surface of the structure layer 2 is a smooth plane structure, to ensure the aesthetics and comfort of the rear cover 10 of the electronic device and improve the user experience.

As shown in FIG. 4 and FIG. 5, the body portion 1 is provided with a first balance hole 11, the structure layer 2 is provided with a second balance hole 22, and an air-permeable channel 3 is provided between the rear surface of the body portion 1 and a front surface of the structure layer 2. The first balance hole 11, the air-permeable channel 3, and the second balance hole 22 are sequentially in communication with each other and form the balance channel, and the second balance hole 22 is located at the rear end 71 of the balance channel. Alternatively, the first balance hole 11 and the second balance hole 22 may be arranged coaxially. That is, the balance channel is provided directly vertically through the body portion 1 and the structure layer 2 in sequence in the thickness direction. The arrangement of the air-permeable channel 3 facilitates the deployment of the first balance hole 11 and the second balance hole 22, making the arrangement positions of the balance holes more flexible.

As shown in FIG. 4, the body portion 1 includes a cover body 12 and a mounting member 13. The cover body 12 is provided with a second mounting hole. The second mounting hole is configured for mounting the mounting member 13. In addition, the mounting member 13 and the second mounting hole are circumferentially fixed in a sealed manner, and the structure layer 2 is fixed on a rear surface of the mounting member 13. Therefore, the mounting member 13 is provided with the foregoing first balance hole 11, and the foregoing air-permeable channel 3 is provided between the mounting member 13 and the structure layer 2.

The cover body 12 and the mounting member 13 have a structure similar to a splicing structure, and the two parts are fixed through bonding. As shown in FIG. 4, an extension edge 131 circumferentially extends outward (that is, to the side toward the cover body 12) on a front end surface of the mounting member 13, and the rear surface of the extension edge 131 and the front surface of the cover body 12 may be fixed through bonding and sealing.

Certainly, in this embodiment, the body portion 1 may alternatively be set as an integral structure, and when the body portion 1 is set as a structure including the cover body 12 and the mounting member 13, only the mounting member 13 needs to be processed, so that the balance channel passes through the mounting member 13, and the structure layer 2 is fixed to the mounting member 13. Therefore, the mounting member 13 may be set to a metal material, which facilitates finishing on the mounting member 13 and can reduce the processing cost. It is unnecessary to make a requirement for the material of the cover body 12, and the cover body 12 may be set to be plastic, glass, ceramics, or the like. Such setting can meet the diversified needs of users while simplifying the processing technology and reducing the processing cost.

As shown in FIG. 4 and FIG. 5, a protrusion 14 is further circumferentially backward arranged on the rear surface of the mounting member 13. The protrusion 14 can form a mounting groove in an enclosed manner, and the structure layer 2 is located inside the mounting groove. The protrusion 14 can protect the structure layer 2 located inside the mounting groove, and when viewed from the side, only the protrusion 14 of the mounting member 13 is visible, and the structure layer 2 is invisible. Such arrangement can also improve the aesthetics, thereby improving the user experience. In addition, the rear end surface of the protrusion 14 transitions smoothly with the rear surface of the structure layer 2. Herein, the setting of the smooth transition specifically means that the rear end surface of the protrusion 14 and the rear surface of the structure layer 2 can be aligned, or may be that the rear end surface of the protrusion 14 protrudes backward (for example, by 0.05 mm) relative to the rear surface of the structure layer 2. However, the side of the rear end surface of the protrusion 14 facing the structure layer 2 may be provided with a chamfering structure to be engaged with the rear surface of the structure layer 2, so that the user will not feel the sharp edge structure in a process of using a finger to slide from the structure layer 2 to the protrusion 14, thereby ensuring the comfort of use. In addition, when the rear surface of the protrusion 14 protrudes beyond the rear surface of the structure layer 2, the structure layer 2 can further be circumferentially protected.

As shown in FIG. 5, the structure layer 2 and the body portion 1 are fixed by an adhesive bonding layer 5, to ensure the stability of the connection between the two parts, and the sealing performance between the two parts can be ensured; and no adhesive bonding layer 5 is arranged at a position between the first balance hole 11 and the second balance hole 22, so that a gap is formed at this position between the structure layer 2 and the body portion 1. The gap forms the foregoing air-permeable channel 3. Alternatively, a groove may alternatively be provided on the front surface of the structure layer 2 and/or the rear surface of the body portion 1. The groove can form an air-permeable channel 3 between the structure layer 2 and the body portion 1, and when the air-permeable channel 3 is formed through the adhesive bonding layer 5, the manufacturing process can be simplified, and the processing cost can be reduced.

Certainly, in this embodiment, a manner of fixing between the structure layer 2 and the body portion 1 is not limited. For example, the structure layer 2 and the body portion 1 may alternatively be integrally formed by injection molding or formed by compression molding, which may specifically be set according to the materials and the like of the structure layer 2 and the body portion 1.

In this embodiment, the balance valve 4 is arranged on a front surface of the body portion 1, and is fixed to the front surface of the body portion 1 in a circumferential direction of the first balance hole 11 in a sealed manner. Certainly, the balance valve 4 may alternatively be arranged on the rear surface of the body portion 1, and is fixed in a circumferential direction of the first balance hole 11 in a sealed manner. When the balance valve 4 is arranged on the front surface of the body portion 1, no mounting space needs to be provided for the balance valve 4 between the body portion 1 and the structure layer 2, which can reduce the overall thickness of the rear cover 10 and reduce mounting requirements. As shown by the arrow in FIG. 5, the balance channel sequentially passes through the inside of the whole machine, the balance valve 4, the first balance hole 11 of the body portion 1, the air-permeable channel 3 between the body portion 1 and the structure layer 2, the second balance hole 22 of the structure layer 2, and the outside of the whole machine from the inside to the outside.

As shown in FIG. 5, an annular boss 15 is further arranged on the front surface of the body portion 1 in the circumferential direction of the first balance hole 11. The front surface of the annular boss 15 is also a smooth plane, and forms a sealing surface 16. The sealing surface 16 is configured to block the balance channel through a sealing member during air tightness detection on the rear cover 10.

Specifically, before the rear cover 10 is assembled into the whole machine, air tightness detection needs to be performed separately on the rear cover 10. During detection, the sealing surface 16 is first sealed by the sealing member, so that the balance channel is blocked. In this case, the balance channel is in a sealed state, and gas cannot pass through along the balance channel. Subsequently, a sealing hood is covered on the front surface of the body portion 1. The sealing hood is similar to the foregoing hood body 20. The sealing hood is covered on the entire mounting member 13, and is attached to the front surface of the cover body 12 of the body portion 1 in a sealed manner. If the body portion 1 further includes other splicing structures, an air-permeable situation may occur at the splicing seams. In this case, it is necessary to cover all the splicing seams inside the sealing hood, then a pressurization or depressurization operation may be performed inside the sealing hood, and the pressure inside the sealing hood may be simultaneously monitored. If the pressure change inside the sealing hood can be stabilized within a certain value range, it means that the individual sealing performance of the rear cover 10 is qualified. If the sealing performance of the rear cover 10 is qualified, after the rear cover 10 is mounted on the whole machine, air tightness detection is performed on the whole machine through the detection apparatus.

Because the material of the cover body 12 of the body portion 1 is plastic, glass, metal, or the like, its front surface is mostly a smooth plane structure. Therefore, the sealing hood may be directly covered on the front surface of the cover body 12, and fixed by a fixture, so that the sealing hood is attached to the front surface of the cover body 12 in a sealed manner.

The front surface of the annular boss 15 is a smooth plane, to ensure that the front surface can fit with the sealing member for sealing. Specifically, the specific structure of the sealing member is not limited, which may be a sealing hood or an airtight sealing membrane.

Based on the arrangement of the annular boss 15, a mounting space for mounting the balance valve 4 can be formed inside the annular boss 15, which avoid interference between the sealing member and the balance valve 4 when the balance channel is blocked through the sealing member, so as to ensure the state of the balance valve 4 during individual air tightness detection on the rear cover 10 to be consistent with the state of the balance valve 4 during air tightness detection of the whole machine.

Specifically, the arrangement of the annular boss 15 is not limited, which may be, for example, a boss structure that is separately arranged on the front surface of the body portion 1 in the circumferential direction of the front end 71 of the balance channel, or may be that a groove is provided on the front surface of the body portion 1, and a first balance hole 11 is provided at the bottom of the groove.

Figure 6:
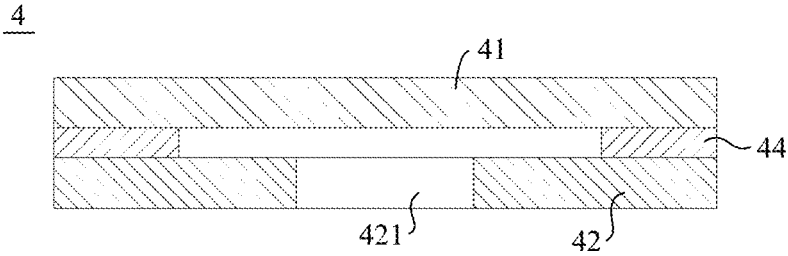
FIG. 6 is an enlarged view of a balance valve in FIG. 5.

As shown in FIG. 6, the balance valve 4 includes a waterproof and air-permeable membrane 41, which may specifically be a PTFE (Polytetrafluoroethylene, polytetrafluoroethylene) microporous membrane. In addition, because the PTFE microporous membrane is relatively thin, which is about 0.1 mm, in order to ensure the overall structural strength of the balance valve 4, the balance valve 4 further includes a support sheet 42. The support sheet 42 may be made of a PET (Polyethylene terephthalate, polyethylene terephthalate) material, and the support sheet 42 can be bonded with the waterproof and air-permeable membrane 41 through an adhesive layer, for providing support for the waterproof and air-permeable membrane 41, thereby avoiding rupture of the waterproof and air-permeable membrane 41 due to changes in air pressure.

Specifically, as shown in FIG. 5 and FIG. 6, the waterproof and air-permeable membrane 41 is sandwiched between the front surface of the body portion 1 and the rear surface of the support sheet 42. The waterproof and air-permeable membrane 41 and the front surface of the body portion 1 are bonded through a first adhesive layer 43, and the waterproof and air-permeable membrane 41 and the support sheet 42 are bonded through a second adhesive layer 44. The body portion 1 is provided with a first balance hole 11, and the first adhesive layer 43 and the second adhesive layer 44 all avoid the arrangement of the first balance hole 11, to avoid affecting the communication of the balance channel. In other words, both the first adhesive layer 43 and the second adhesive layer 44 are annular structures arranged around the circumferential direction of the first balance hole 11. In addition, the support sheet 42 is further provided with a through hole 421 at a position corresponding to the first balance hole 11. The through hole 421 is in communication with the first balance hole 11, to ensure the communication of the balance channel. Specifically, the quantity of through holes 421 is not limited. There may be one through hole 421, or a plurality of through holes 421 may be spaced apart.

Certainly, in this embodiment, the balance valve 4 may alternatively be set as a valve structure. When the balance valve 4 is set as a structure including a waterproof and air-permeable membrane 41 and a support sheet 42, the overall structure of the balance valve 4 can be simplified, and the size of the balance valve 4 in the thickness direction can be reduced, thereby reducing the overall thickness of the rear cover 10, and helping to realize the objective of lightening and thinning the electronic device.

Figure 7:
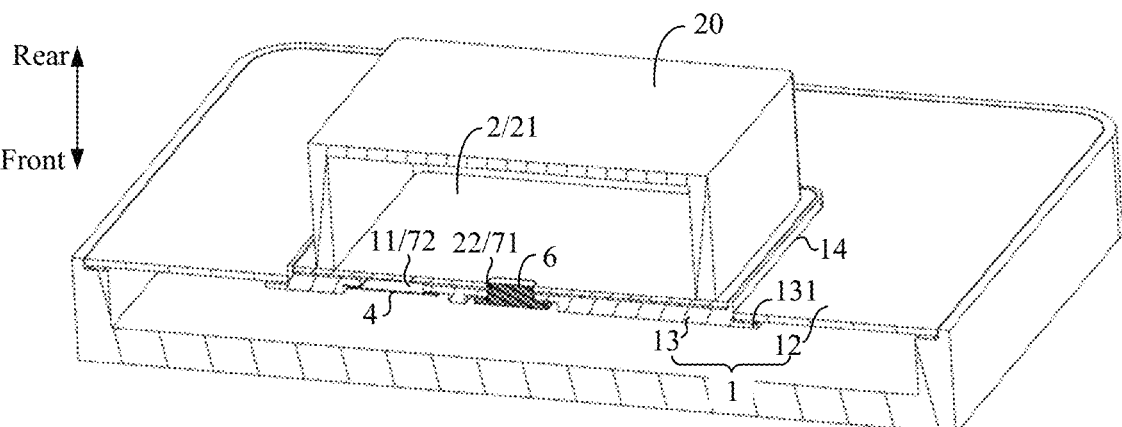
FIG. 7 is a schematic structural diagram of a rear cover and a hood body in FIG. 4 in a detection state.

The embodiments of this application further provide an air tightness detection system of an electronic device. As shown in FIG. 7, the air tightness detection system of an electronic device includes a detection apparatus and the foregoing electronic device. The detection device includes a hood body 20 and a fixing fixture. An opening end of the hood body 20 can be attached to the rear surface of the structure layer 2, and is fixed to the electronic device through the fixing fixture. Specifically, the specific structure and fixing manner of the fixing fixture is no limited. After the opening end of the hood body 20 and the rear surface of the structure layer 2 are attached and fixed, the sealing performance between the two parts can be ensured. The rear end 71 of the balance channel of the rear cover 10 of the electronic device is located inside the hood body 20. Subsequently, a pressurization or depressurization operation may be performed inside the hood body 20, and the pressure inside the hood body 20 may be simultaneously monitored. If the pressure change inside the hood body 20 can be stabilized within a certain value range, it means that the balance channel can play a balancing role, and the sealing performance of the whole electronic device is good.

The principle and implementations of this application are described herein through specific examples. The descriptions of the foregoing embodiments are merely used for helping understand the method and core ideas of this application. It should be noted that a person of ordinary skill in the art may further make several improvements and modifications to this application without departing from the principle of this application. These improvements and modifications also fall within the protection scope of the claims of this application.

What is claimed is:

1. A rear cover of an electronic device, comprising:
a body portion and a structure layer, wherein the structure layer is fixed on a rear surface of the body portion, a rear surface of the structure layer forms a smooth detection plane, and the detection plane is capable of forming a seal with an opening end of a hood body of an air tightness detection device for detecting air tightness of the electronic device in a sealed manner; and
a balance channel is provided through the body portion and the structure layer in a thickness direction, a waterproof and air-permeable balance valve is arranged in the balance channel, and a rear end of the balance channel is located within the detection plane.

2. The rear cover of an electronic device according to claim 1, wherein the body portion is provided with a first balance hole, the structure layer is provided with a second balance hole, an air-permeable channel is provided between a front surface of the structure layer and the rear surface of the body portion, the first balance hole, the air-permeable channel, and the second balance hole are sequentially in communication with each other and form the balance channel, and the second balance hole is located at the rear end of the balance channel.

3. The rear cover of an electronic device according to claim 2, wherein the front surface of the structure layer and the rear surface of the body portion are bonded by an adhesive bonding layer, and the adhesive bonding layer is provided with the air-permeable channel.

4. The rear cover of an electronic device according to claim 2, wherein the structure layer is a lens glass cover plate.

5. The rear cover of an electronic device according to claim 4, further comprising a flash shield, wherein the lens glass cover plate is provided with a first mounting hole adapted to the flash shield, and a gap between an inner wall of the first mounting hole and an outer wall of the flash shield forms the second balance hole.

6. The rear cover of an electronic device according to claim 2, wherein the body portion comprises a cover body and a mounting member, the cover body is provided with a second mounting hole, the mounting member is mounted inside the second mounting hole, and is circumferentially fixed in a sealed manner, the structure layer is fixed on a rear surface of the mounting member, and the mounting member is provided with the first balance hole.

7. The rear cover of an electronic device according to claim 6, wherein a protrusion is circumferentially arranged on a rear surface edge of the mounting member, the protrusion forms a mounting groove in an enclosed manner, the structure layer is located inside the mounting groove, and a rear end surface of the protrusion transitions smoothly with the rear surface of the structure layer.

8. The rear cover of an electronic device according to claim 2, wherein the balance valve is arranged on a front surface of the body portion, and is fixed to the front surface of the body portion in a circumferential direction of the first balance hole in a sealed manner.

9. The rear cover of an electronic device according to claim 8, wherein an annular boss is further arranged on the front surface of the body portion in the circumferential direction of the first balance hole, a front end surface of the annular boss forms a sealing surface, and the sealing surface is configured to block the balance channel through a sealing member.

10. The rear cover of an electronic device according to claim 1, wherein the balance valve comprises a waterproof and air-permeable membrane.

11. The rear cover of an electronic device according to claim 10, wherein the balance valve further comprises a support sheet, the support sheet is fixed to the waterproof and air-permeable membrane through bonding, and the support sheet is provided with a through hole in communication with the balance channel.

12. The rear cover of an electronic device according to claim 1, wherein the rear surface of the body portion is formed by splicing one or at least two of a vegan leather layer, a silica gel layer, a glass layer, a ceramic layer, or a metal layer.

13. An electronic device, comprising a rear cover, wherein the rear cover comprises:

a body portion and a structure layer, wherein the structure layer is fixed on a rear surface of the body portion, a rear surface of the structure layer forms a smooth detection plane, and the detection plane is capable of forming a seal with an opening end of a hood body of an air tightness detection device for detecting air tightness of the electronic device in a sealed manner; and a balance channel is provided through the body portion and the structure layer in a thickness direction, a waterproof and air-permeable balance valve is arranged in the balance channel, and a rear end of the balance channel is located within the detection plane.

14. An air tightness detection system of an electronic device, comprising a detection apparatus and the electronic device according to claim 13, wherein the detection apparatus comprises the hood body and a fixing fixture, the opening end of the hood body is capable of being attached to the detection plane on the rear surface of the structure layer, and is fixed to the electronic device through the fixing fixture, so that the opening end of the hood body is attached to the detection plane in the sealed manner.

15. The electronic device according to claim 13, wherein the body portion is provided with a first balance hole, the structure layer is provided with a second balance hole, an air-permeable channel is provided between a front surface of the structure layer and the rear surface of the body portion, the first balance hole, the air-permeable channel, and the second balance hole are sequentially in communication with each other and form the balance channel, and the second balance hole is located at the rear end of the balance channel.

16. The electronic device according to claim 15, wherein the front surface of the structure layer and the rear surface of the body portion are bonded by an adhesive bonding layer, and the adhesive bonding layer is provided with the air-permeable channel.

17. The electronic device according to claim 15, wherein the structure layer is a lens glass cover plate.

18. The electronic device according to claim 17, wherein the rear cover further comprises a flash shield, wherein the lens glass cover plate is provided with a first mounting hole adapted to the flash shield, and a gap between an inner wall of the first mounting hole and an outer wall of the flash shield forms the second balance hole.

19. The electronic device according to claim 15, wherein the body portion comprises a cover body and a mounting member, the cover body is provided with a second mounting hole, the mounting member is mounted inside the second mounting hole, and is circumferentially fixed in a sealed manner, the structure layer is fixed on a rear surface of the mounting member, and the mounting member is provided with the first balance hole.

20. The electronic device according to claim 19, wherein a protrusion is circumferentially arranged on a rear surface edge of the mounting member, the protrusion forms a mounting groove in an enclosed manner, the structure layer is located inside the mounting groove, and a rear end surface of the protrusion transitions smoothly with the rear surface of the structure layer.

\* \* \* \* \*